United States Patent
Nakamura et al.

(10) Patent No.: US 8,471,139 B2
(45) Date of Patent: Jun. 25, 2013

(54) THERMOELECTRIC CONVERSION MODULE AND METHOD FOR MANUFACTURING THERMOELECTRIC CONVERSION MODULE

(75) Inventors: Takanori Nakamura, Nagaokakyo (JP); Shuji Matsumoto, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 110 days.

(21) Appl. No.: 12/978,008

(22) Filed: Dec. 23, 2010

(65) Prior Publication Data

US 2011/0088737 A1   Apr. 21, 2011

Related U.S. Application Data

(63) Continuation of application No. PCT/JP2009/061686, filed on Jun. 26, 2009.

(30) Foreign Application Priority Data

Jul. 2, 2008   (JP) ................................. 2008-173694

(51) Int. Cl.
 *H01L 35/02* (2006.01)
 *H01L 35/34* (2006.01)

(52) U.S. Cl.
 USPC ........... 136/200; 136/201; 136/202; 136/203; 136/204; 136/205; 136/206; 136/207; 136/208; 136/209; 136/210; 136/211; 136/212; 62/3.1

(58) Field of Classification Search
 USPC ..................... 136/200–212; 62/3.1
 See application file for complete search history.

(56) References Cited

U.S. PATENT DOCUMENTS

| | | | |
|---|---|---|---|
| 5,009,717 A | * | 4/1991 | Komabayashi et al. ...... 136/201 |
| 2001/0001961 A1 | * | 5/2001 | Hiraishi et al. ............... 136/201 |
| 2006/0289051 A1 | | 12/2006 | Niimi et al. |

FOREIGN PATENT DOCUMENTS

| | | |
|---|---|---|
| EP | 0 880 184 A2 | 11/1998 |
| JP | 9-243201 A | 9/1997 |
| JP | 9-293909 A | 11/1997 |
| JP | 10-209509 A | 8/1998 |
| JP | 10-209510 | 8/1998 |

(Continued)

OTHER PUBLICATIONS

Written Opinion from International Application PCT/JP2009/061686 dated Jan. 9, 2009.

(Continued)

*Primary Examiner* — Jennifer Michener
*Assistant Examiner* — Matthew Martin
(74) *Attorney, Agent, or Firm* — Dickstein Shapiro LLP

(57) ABSTRACT

A thermoelectric conversion module which has a P-type thermoelectric conversion material and an N-type thermoelectric conversion material electrically connected to each other. The P-type thermoelectric conversion material and the N-type thermoelectric conversion material are joined with insulating material particles (ceramic spherical particles) interposed therebetween, so as not to be electrically connected to each other. The insulating material particles are joined to the P-type thermoelectric conversion material with a first adhesive material interposed therebetween and to the N-type thermoelectric conversion material with a second adhesive material interposed therebetween, and the P-type thermoelectric conversion material and the N-type thermoelectric conversion material are electrically connected to each other in a region other than the region in which the thermoelectric conversion materials are joined with the first and second adhesive material and the insulating material particles interposed therebetween.

8 Claims, 6 Drawing Sheets

FOREIGN PATENT DOCUMENTS

| | | |
|---|---|---|
| JP | 11-298051 A | 10/1999 |
| JP | 2000-286467 A | 10/2000 |
| JP | 2002-309065 A | 10/2002 |
| JP | 2003-174204 A | 6/2003 |
| JP | 2004-273998 A | 9/2004 |
| JP | 2005-171217 A | 6/2005 |
| JP | 2006-121006 A | 5/2006 |

OTHER PUBLICATIONS

Supplementary European Search Report issued for corresponding application EP 09 77 3400, date of completion of search report is Sep. 17, 2012.

Japanese Office Action issued Aug. 28, 2012 for corresponding application JP 2010-519030 with English translation.

* cited by examiner

US 8,471,139 B2

THERMOELECTRIC CONVERSION MODULE AND METHOD FOR MANUFACTURING THERMOELECTRIC CONVERSION MODULE

CROSS REFERENCE TO RELATED APPLICATIONS

The present application is a continuation of International Application No. PCT/JP2009/061686, filed Jun. 26, 2009, which claims priority to Japanese Patent Application No. JP2008-173694, filed Jul. 2, 2008, the entire contents of each of these applications being incorporated herein by reference in their entirety.

FIELD OF THE INVENTION

The present invention relates to a thermoelectric conversion module and a method for manufacturing the thermoelectric conversion module, and more particularly, relates to a thermoelectric conversion module which has a P-type thermoelectric conversion material and an N-type thermoelectric conversion material joined with an insulating material interposed therebetween and has an increased occupancy of the thermoelectric conversion materials per area, and a method for manufacturing the thermoelectric conversion module.

BACKGROUND OF THE INVENTION

In recent years, for the purpose of preventing global warming, the reduction of carbon dioxide has come to be a critical issue, and attention has been focused on thermoelectric conversion elements capable of converting heat directly into electricity as one of effective techniques for waste heat utilization.

Furthermore, as a conventional thermoelectric conversion element, for example, a thermoelectric conversion element 50 is known which has a structure including a P-type thermoelectric conversion material 51, an N-type thermoelectric conversion material 52, a lower temperature electrode 56, and a higher temperature electrode 58, as shown in FIG. 8.

In this thermoelectric conversion element 50, the two types of thermoelectric conversion materials 51, 52 are materials for energy conversion between heat and electricity, which are connected to lower temperature electrodes 56 at lower temperature joints 53b as their respective lower temperature end surfaces. In addition, the thermoelectric conversion materials 51, 52 are connected to each other at higher temperature joints 53a as their respective higher temperature end surfaces, through the higher temperature electrode 58.

Then, in this thermoelectric conversion element 50, when a difference in temperature is provided between the higher temperature joints 53a and the lower temperature joints 53b, an electromotive force is produced as a result of the Seebeck effect, and electric power is then extracted.

In the meanwhile, the electric generating capacity of a thermoelectric conversion element is determined by thermoelectric conversion characteristics of the material and the difference in temperature provided to the element, and also affected significantly by the occupancy (the ratio of the area occupied by the thermoelectric conversion material section in a plane perpendicular to the direction of the difference in temperature caused in the thermoelectric conversion element) of the thermoelectric conversion material, and the increased occupancy of the thermoelectric conversion material allows the electric generating capacity of the thermoelectric conversion element per unit area to be increased.

However, in the case of the structure of a conventional example as in the thermoelectric conversion element 50, there is a limit to the increase in the occupancy of the thermoelectric conversion materials, because a void layer for insulation is provided between the two types of thermoelectric conversion materials 51, 52.

Thus, for example, as shown in FIGS. 9(a) and (b), a thermoelectric conversion module has been proposed in which a P-type thermoelectric conversion material 51 and an N-type thermoelectric conversion material 52 are joined with an insulating layer 61 interposed therebetween, and the P-type thermoelectric conversion material 51 and the N-type thermoelectric conversion material 52 are electrically connected through an electrode 62 on the sides of the top and bottom surfaces (see Patent Document 1).

Specifically, as shown in FIG. 9(b), the P-type thermoelectric conversion material 51 and the N-type thermoelectric conversion material 52 are joined at sides (joint surfaces) thereof with the insulating layer 61 interposed therebetween, while the side of the top surface has a carbon electrode 71 provided thereon, with a nickel based wax 72 and a molybdenum electrode 73 provided sequentially on the carbon electrode 71, in such a way that the P-type thermoelectric conversion material 51 and the N-type thermoelectric conversion material 52 are electrically connected to each other by the electrode 62 composed of the carbon electrode 71, the nickel based wax 72, and the molybdenum electrode 73.

Furthermore, as the material constituting the insulating layer 61, an electrically insulating material is used which has ceramic particles dispersed in a glass matrix.

The thus configured thermoelectric conversion module has the P-type thermoelectric conversion material 51 and the N-type thermoelectric conversion material 52 joined with the insulating layer 61 interposed therebetween, in such a way that there is no space between the both thermoelectric conversion materials, thus has an increased occupancy of the thermoelectric conversion materials, and can improve the electric generating capacity per unit area.

Patent Document 1: Japanese Patent Application Laid-Open No. 2000-286467

However, in the case of joining the P-type thermoelectric conversion material 51 and the N-type thermoelectric conversion material 52 with the use of the electrically insulating material of the ceramic particles dispersed in the glass matrix as in the case of the conventional thermoelectric conversion module, when the glass component constituting the glass matrix has conductivity due to impurities, or comes to have conductivity by diffusion of the constituents of the thermoelectric conversion materials in a firing step, there is a problem of insufficient insulation between the P-type thermoelectric conversion material and the N-type thermoelectric conversion material, thereby leading to degradation of characteristics.

SUMMARY OF THE INVENTION

The present invention has been achieved in view of the actual circumstance described above, and an object of the present invention is to provide a thermoelectric conversion module which has a structure of a P-type thermoelectric conversion material and an N-type thermoelectric conversion material joined at predetermined joint surfaces thereof, which makes it possible to ensure that the joint surfaces of the P-type thermoelectric conversion material and the N-type thermoelectric conversion material are insulated from each other and has an increased occupancy of the thermoelectric conversion materials with high reliability, and a method for manufacturing the thermoelectric conversion module.

In order to solve the problem described above, the thermoelectric conversion module of the present invention is characterized in that a thermoelectric conversion module which has a P-type thermoelectric conversion material and an N-type thermoelectric conversion material electrically connected to each other. The P-type thermoelectric conversion material and the N-type thermoelectric conversion material are joined with insulating material particles interposed between joint surfaces of the both thermoelectric conversion materials, so as not to be electrically connected to each other. The insulating material particles are joined to the P-type thermoelectric conversion material with a first adhesive material interposed therebetween and to the N-type thermoelectric conversion material with a second adhesive material interposed therebetween. The P-type thermoelectric conversion material and the N-type thermoelectric conversion material are electrically connected to each other in a region other than the region in which the thermoelectric conversion materials are joined with the first adhesive material and the second adhesive material and the insulating material particles interposed therebetween.

Preferably, the insulating material particles have a 3CV value of 20% or less indicating a variation in particle diameter.

Preferably, the insulating material particles are ceramic spherical particles which have an average particle diameter of 0.05 to 0.6 mm.

In addition, preferably, the first and second adhesive materials are glass based materials.

Furthermore, the method for manufacturing a thermoelectric conversion module of the present invention is characterized in that it is a method for manufacturing a thermoelectric conversion module wherein a P-type thermoelectric conversion material and an N-type thermoelectric conversion material are joined with insulating material particles interposed therebetween, the insulating material particles are joined to the P-type thermoelectric conversion material with a first adhesive material interposed therebetween and to the N-type thermoelectric conversion material with a second adhesive material interposed therebetween, and the P-type thermoelectric conversion material and the N-type thermoelectric conversion material are electrically connected to each other in a region other than the region in which the thermoelectric conversion materials are joined with the first adhesive material and the second adhesive material and the insulating material particles interposed therebetween. The method includes the steps of: preparing the P-type thermoelectric conversion material and the N-type thermoelectric conversion material; applying the first adhesive material to a joint surface of the P-type thermoelectric conversion material, the joint surface to be joined to the N-type thermoelectric conversion material with the insulating material particles interposed therebetween, and applying the second adhesive material to a joint surface of the N-type thermoelectric conversion material, the joint surface to be joined to the P-type thermoelectric conversion material with the insulating material particles interposed therebetween; providing at least one of the joint surfaces of the P-type thermoelectric conversion material and the N-type thermoelectric conversion material, the at least one joint surface with the first or second adhesive material applied thereto, with the insulating material particles with a particle diameter greater than the total thickness of the first and second adhesive materials applied to the pair of joint surfaces, to allow the first and second adhesive materials to hold the insulating material particles; and attaching the P-type thermoelectric conversion material and the N-type thermoelectric conversion material to each other with the insulating material particles and the first and second adhesive materials interposed therebetween.

Preferably, particles with a 3CV value of 20% or less indicating a variation in particle diameter are used as the insulating material particles.

Preferably, ceramic spherical particles with an average particle diameter of 0.05 to 0.6 mm are used as the insulating material particles.

Preferably, glass based materials are used as the first and second adhesive materials.

In the thermoelectric conversion module according to the present invention, the P-type thermoelectric conversion material and the N-type thermoelectric conversion material are joined with the insulating material particles interposed therebetween, so as not to be electrically connected, and the insulating material particles are joined to the P-type thermoelectric conversion material with the first adhesive material interposed therebetween and joined to the N-type thermoelectric conversion material with the second adhesive material interposed therebetween. Thus, even when the first and second adhesive materials composed of, for example, a glass component have conductivity due to impurities, or come to have conductivity by diffusion of the constituents of the thermoelectric conversion materials in a firing step, the thermoelectric conversion module makes it possible to ensure that the insulation is kept between the P-type thermoelectric conversion material and the N-type thermoelectric conversion material, and thus provide a thermoelectric conversion module which has an increased occupancy of the thermoelectric conversion materials with high reliability.

It is to be noted that the first adhesive material and the second adhesive material may be the same material, or may be different materials in the present invention.

In addition, when particles with a 3CV value of 20% or less indicating a variation in particle diameter are used as the insulating material particles, the thermoelectric conversion module with the substantially parallel joint surfaces of the P-type thermoelectric conversion material 1 and the N-type thermoelectric conversion material 2 allows the joint surfaces to be opposed at approximately the same distance in any position, as schematically shown in FIG. 2, and this configuration thus makes it possible to arrange a number of P-type thermoelectric conversion materials 1 and N-type thermoelectric conversion materials 2 in an aligned manner, and thus provide a thermoelectric conversion module which has an increased occupancy of the thermoelectric conversion materials with high reliability.

The use of the ceramic spherical particles with an average particle diameter of 0.05 to 0.6 mm as the insulating material particles makes it possible to ensure that the joint surfaces of the P-type thermoelectric conversion material and the N-type thermoelectric conversion material are kept substantially parallel to each other, and thus provide a thermoelectric conversion module which has an increased occupancy of the thermoelectric conversion materials with high reliability.

In addition, the use of the glass based materials as the first and second adhesive materials makes it possible to ensure that a thermoelectric conversion module is provided which has a structure in which the P-type thermoelectric conversion material and the N-type thermoelectric conversion material are joined with the first and second adhesive materials and the insulating material particles interposed therebetween.

Furthermore, in the method for manufacturing a thermoelectric conversion module according to the present invention, the adhesive materials (the first and second adhesive materials) are applied to the pair of joint surfaces of the P-type thermoelectric conversion material and the N-type thermoelectric conversion material, which are to be joined to each other with the insulating material particles interposed therebetween, at least one of the pair of joint surfaces with the adhesive materials applied thereto is provided with the insulating material particles with a particle diameter greater than the total thickness of the adhesive materials applied to the pair of joint surfaces, to allow the adhesive materials to hold the insulating material particles, and the P-type thermoelectric conversion material and the N-type thermoelectric conversion material are then attached to each other with the insulating material particles and the adhesive materials interposed therebetween. Thus, the method makes it possible to ensure that the insulation is kept between the P-type thermoelectric conversion material and the N-type thermoelectric conversion material, and to efficiently manufacture a thermoelectric conversion module which has an increased occupancy of the thermoelectric conversion materials with high reliability.

The use of particles with a 3CV value of 20% or less indicating a variation in particle diameter as the insulating material particles allows the joint surfaces of the P-type thermoelectric conversion material 1 and the N-type thermoelectric conversion material 2 to be kept substantially parallel to each other, and thus allows a thermoelectric conversion module which has an increased occupancy of the thermoelectric conversion materials with high reliability to be manufactured efficiently.

The use of the ceramic spherical particles with an average particle diameter of 0.05 to 0.6 mm as the insulating material particles makes it possible to ensure that the joint surfaces of the P-type thermoelectric conversion material and the N-type thermoelectric conversion material are kept substantially parallel to each other, and thus manufacture, with more certainty, a thermoelectric conversion module which has an increased occupancy of the thermoelectric conversion materials with high reliability.

In addition, the use of the glass based materials as the first and second adhesive materials makes it possible to manufacture a thermoelectric conversion module efficiently even with certainty, which has a structure in which the P-type thermoelectric conversion material and the N-type thermoelectric conversion material are joined with the first and second adhesive materials and the insulating material particles interposed therebetween.

BRIEF EXPLANATION OF THE DRAWINGS

FIGS. 9(a) and 9(b) are diagrams illustrating another conventional thermoelectric conversion module, in which FIG. 9(a) is a plan view, and FIG. 9(b) is a diagram illustrating an enlarged main section.

Figure 1:
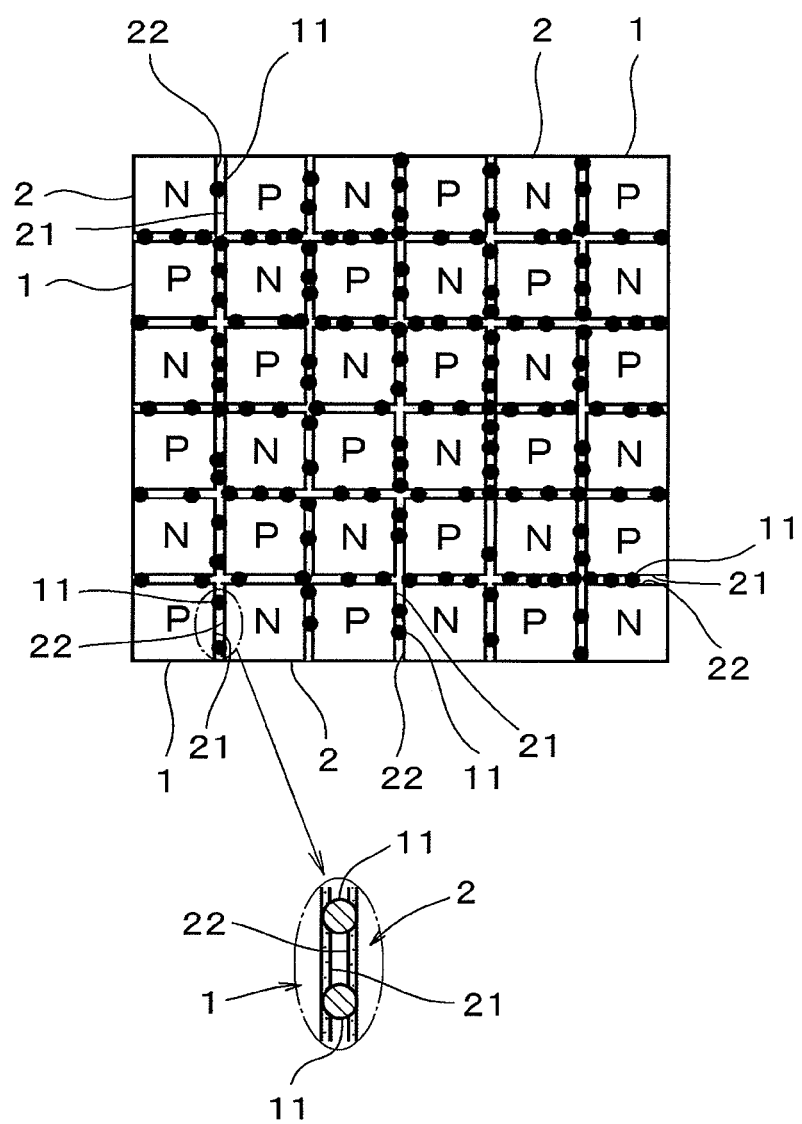
FIG. 1 is a plan view illustrating a thermoelectric conversion module according to an example of the present invention.

REFERENCE NUMERALS 1 thermoelectric element (P-type thermoelectric conversion material)
2 thermoelectric element (N-type thermoelectric conversion material)
11 ceramic spherical particles (insulating material particles)
12 electrode
21 first adhesive material (glass based material)
22 second adhesive material (glass based material)

DETAILED DESCRIPTION OF THE INVENTION

Features of the present invention will be described in more detail below with reference to an example of the present invention.

EXAMPLE

Figure 2:
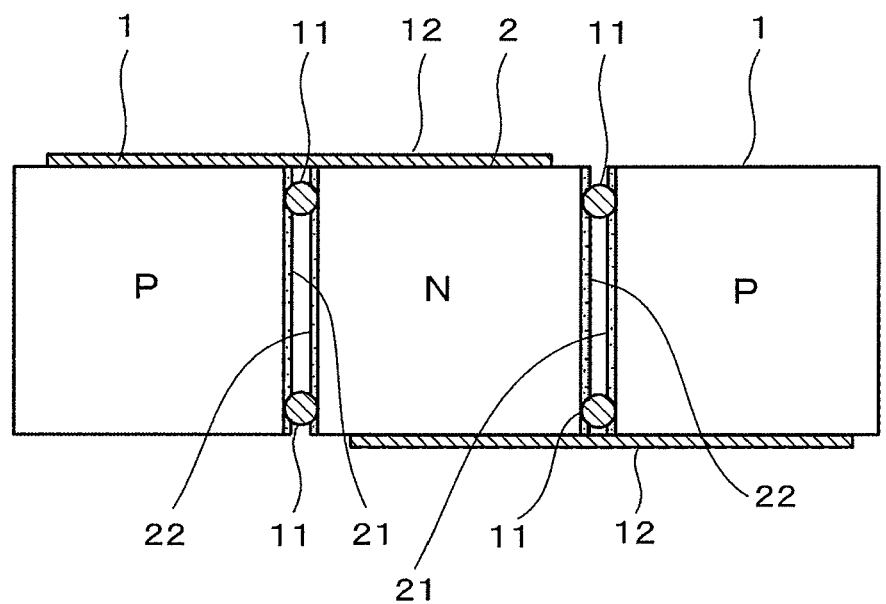
FIG. 2 is a cross-sectional elevational view illustrating the structure of a main section of the thermoelectric conversion module of FIG. 1.

FIG. 1 is a plan view schematically illustrating the structure of a thermoelectric conversion module according to an example of the present invention, and FIG. 2 is a cross-sectional elevational view illustrating an enlarged main section.

In this thermoelectric conversion module, as shown in FIGS. 1 and 2, thermoelectric elements (a P-type thermoelectric conversion material 1 and an N-type thermoelectric conversion material 2) are joined so as not to be electrically connected to each other, with ceramic spherical particles (insulating material particles) 11 of, for example, 0.05 to 0.6 mm in particle diameter interposed the thermoelectric elements, which have a 3CV value of 20% or less indicating a variation in particle diameter. It is to be noted that spherical zirconium oxide beads are used as the ceramic spherical particles 11.

Furthermore, the ceramic spherical particles 11 are joined to the P-type thermoelectric conversion material 1 with a glass based material 21 as a first adhesive material interposed therebetween, and joined to the N-type thermoelectric conversion material 2 with a glass based material 22 as a second adhesive material interposed therebetween, and the glass based material 21 and the glass based material 22 are kept not in contact with each other.

It is to be noted that the same glass based material is used as the first glass based material 21 and the second glass based material 22 in this example. However, it is also possible to use different types of glass as the first and second glass based materials 21, 22.

In addition, electrodes 12 (see FIG. 2) (the electrodes are omitted in FIG. 1) are provided in a region (on the top surface and bottom surface in the case of the thermoelectric conversion module according to this example) other than the region in which the thermoelectric conversion materials are joined with the glass based materials 21, 22 and the ceramic spherical particles 11 interposed therebetween, in such a way that the P-type thermoelectric conversion material 1 and the N-type thermoelectric conversion material 2 are electrically connected in series. In addition, the thermoelectric conversion module according to this example is formed from 36 thermoelectric elements in total, in a matrix of 6×6.

However, the thermoelectric conversion module according to the present invention is not to be considered limited to this example, in terms of how to provide the P-type thermoelectric conversion material 1 and the N-type thermoelectric conversion material 2 and the number of P-type thermoelectric conversion materials 1 and N-type thermoelectric conversion materials 2 used.

In addition, the electrode for connecting each pair of P-type thermoelectric conversion material 1 and N-type thermoelectric conversion material 2 in series is not particularly limited in terms of how to provide the electrode and how to extract the electrode, which can be determined in consideration of the size and shape of each thermoelectric element, the number of thermoelectric elements used, etc.

In the thermoelectric conversion module according to this example, as described above, the P-type thermoelectric conversion material 1 and the N-type thermoelectric conversion material 2 are joined so as not to be electrically connected, with the ceramic spherical particles 11 as insulating material particles interposed therebetween, the ceramic spherical particles 11 are joined to the P-type thermoelectric conversion material 1 with the glass based material 21 as a first adhesive material interposed therebetween and joined to the N-type thermoelectric conversion material 2 with the glass based material 22 as a second adhesive material interposed therebetween, and the glass based material 21 as a second adhesive material and the glass based material 22 as a second adhesive material are kept not in contact with each other. Thus, even when the glass based materials 21, 22 have conductivity due to impurities, or come to have conductivity by diffusion of the constituents of the thermoelectric conversion materials in a firing step, the thermoelectric conversion module makes it possible to ensure that the insulation is kept between the P-type thermoelectric conversion material 1 and the N-type thermoelectric conversion material 2, thereby providing a thermoelectric conversion module with high reliability.

In addition, since the P-type thermoelectric conversion material 1 and the N-type thermoelectric conversion material 2 are joined with the ceramic spherical particles 11 which have a 3CV value of 20% or less in terms of particle diameter and thus a small variation in particle diameter, the thermoelectric conversion module with the joint surfaces of the P-type thermoelectric conversion material 1 and the N-type thermoelectric conversion material 2 substantially parallel to each other allows the joint surfaces to be opposed at approximately the same distance in any position, as shown in FIGS. 1 and 2. Therefore, this configuration makes it possible to arrange the P-type thermoelectric conversion material 1 and the N-type thermoelectric conversion material 2 tightly while ensuring that the joint surfaces of the P-type thermoelectric conversion material 1 and the N-type thermoelectric conversion material 2 are prevented from coming into direct contact with each other or the glass based materials 21, 22 applied to the joint surfaces are prevented from coming into contact with each other, and thus provide a thermoelectric conversion module which has an increased occupancy of the thermoelectric conversion materials with high reliability.

Further, since the thermoelectric conversion module with the joint surfaces substantially parallel to each other allows the joint surfaces to be opposed at approximately the same distance in any position, and this configuration makes it possible to arrange thermoelectric elements in an aligned manner with a high degree of accuracy in the case of joining a number of P-type thermoelectric conversion materials 1 and N-type thermoelectric conversion materials 2 with the insulating material particles 11 interposed therebetween, thereby providing a thermoelectric conversion module which has an increased occupancy of the thermoelectric conversion materials with high reliability.

Next, a method for manufacturing the thermoelectric conversion module according to this example will be described.

As raw material powders, $La_2O_3$, $Nd_2O_3$, $CeO_2$, $SrCO_3$, and $CuO$ were prepared, and weighed so as to provide predetermined compositions of $(La_{1.98}Sr_{0.02})CuO_4$ as the P-type thermoelectric conversion material and of $(Nd_{1.98}Ce_{0.02})CuO_4$ as the N-type thermoelectric conversion material.

While the oxides were used as the raw material powders for La, Nd, Ce, and Cu raw materials whereas the carbonate was used as the raw material powder for a Sr raw material in this example, the starting raw materials are not to be considered limited to the oxides and carbonate as described above, and it is also possible to use other inorganic materials such as hydroxides and organo-metallic compounds such as acetylacetonate complexes.

The raw material powders weighed for each composition were ground and mixed in a wet ball mill using pure water as a solvent. The slurry containing the raw material powders was subjected to evaporation to obtain a mixed powder.

Then, the mixed powder obtained was subjected to a heat treatment at 900° C. for 8 hours in an air atmosphere to produce the intended oxide powder for the thermoelectric conversion material. It is to be noted that an unreacted portion may remain in this case.

The oxide powders for each thermoelectric conversion material, obtained by carrying out this heat treatment, were mixed with an organic binder at a ratio of 5 weight % to each composition powder, and ground and mixed in a wet ball mill using pure water as a solvent.

After sufficiently drying the respective composition powders mixed with the organic binder, a uniaxial pressing machine was used to produce compacts of the dried composition powders at a pressure 10 MPa.

The compacts were fired in an air atmosphere in the range of 1000° C. to 1100° C. for 2 hours to produce sintered bodies of the compacts composed of the oxide powders for each thermoelectric conversion material.

It is to be noted that the firing temperature in this case varies depending on the compositions of the oxide powders for each thermoelectric conversion material.

Typically, the conditions are set to provide a relative density of 80% or more (preferably 90% or more).

Figure 3:
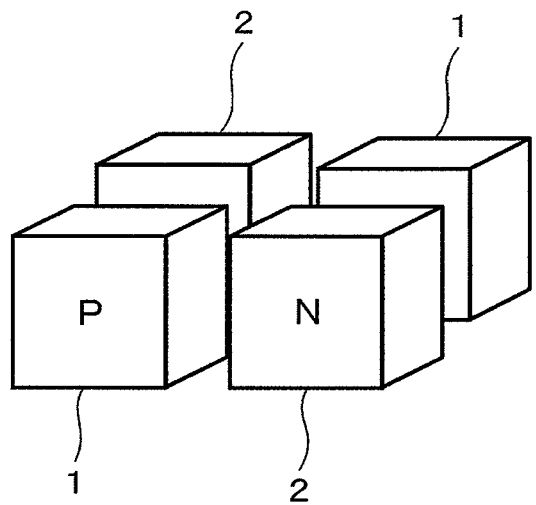
FIG. 3 is a diagram illustrating a step of a method for manufacturing a thermoelectric conversion module according to the example of the present invention.

The sintered bodies were clipped with the use of a dicing saw into a size of 5 mm×5 mm×5 mm to obtain thermoelectric elements (P-type thermoelectric conversion materials 1 and N-type thermoelectric conversion materials 2) as shown in FIG. 3.

Figure 4:
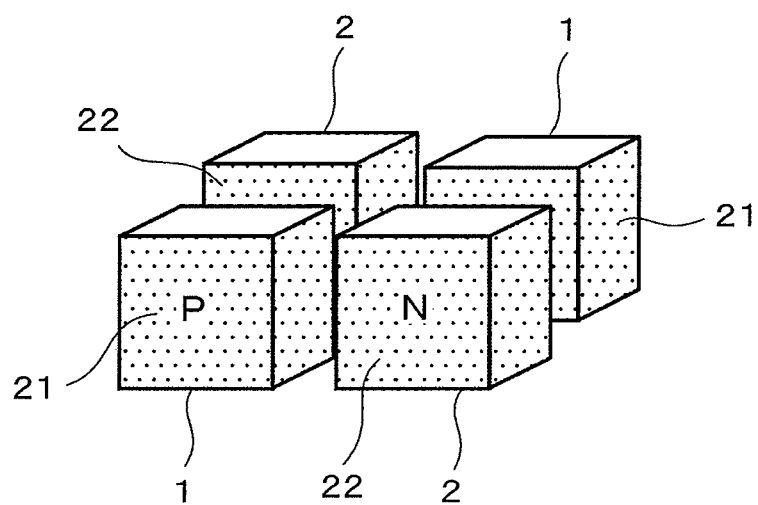
FIG. 4 is a diagram illustrating another step of the method for manufacturing a thermoelectric conversion module according to the example of the present invention.

Then, as shown in FIG. 4, glass pastes (baked first and second adhesive materials (glass based materials)) 21, 22 were applied to four sides of the thermoelectric elements clipped in the predetermined size, which were not intended to serve as conductive surfaces.

Figure 5:
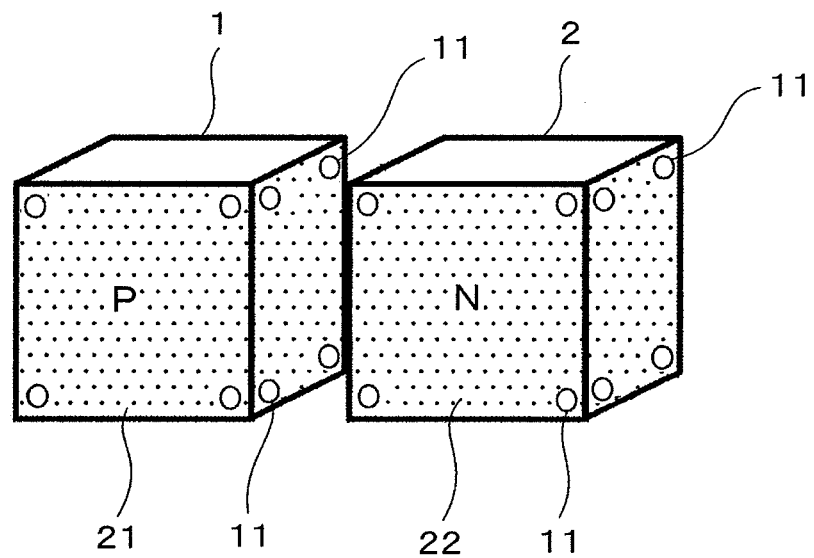
FIG. 5 is a diagram illustrating ceramic spherical particles (spherical zirconium oxide beads) arranged on glass pastes applied to sides of thermoelectric elements in a step for manufacturing a thermoelectric conversion module according to the example of the present invention.

Then, before the glass pastes 21, 22 were dried, ceramic spherical particles (spherical zirconium oxide beads) 11 with an average particle size of 0.1 mm were arranged as insulating material particles so that one or more ceramic spherical particles were distributed on the four corners of the surfaces with the glass pastes 11 applied thereto, as shown in FIG. 5.

Then, a surface of one thermoelectric element 1 with the ceramic spherical particles (spherical zirconium oxide beads) 11 arranged thereon was joined (provisionally joined) with a joint surface of other thermoelectric element 2 with the glass paste 11 applied thereto. The P-type thermoelectric conversion material 1 and the N-type thermoelectric conversion material 2 formed a pair in this way, and this pair of thermoelectric elements is provided so as to make an arrangement as shown in FIG. 1, to provisionally join the respective thermoelectric elements, and then dried in an oven at 150° C.

It is to be noted that while the types of the glass pastes 21, 22 are not particularly limited as long as the glass pastes 21, 22 can hold the ceramic spherical particles 11, it is desirable to select the compositions, concentrations, etc. of the glass pastes 21, 22 appropriately depending on the type, size, shape, etc. of the ceramic spherical particles.

Figure 6:
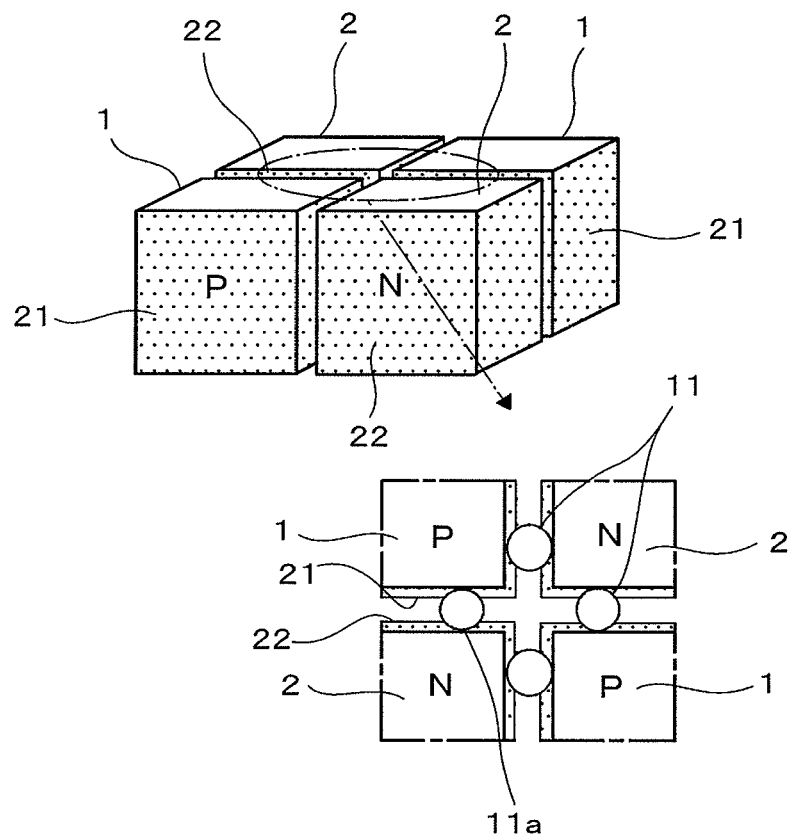
FIG. 6 is a diagram illustrating the respective thermoelectric elements joined in a step for manufacturing a thermoelectric conversion module according to the example of the present invention.
Figure 7:
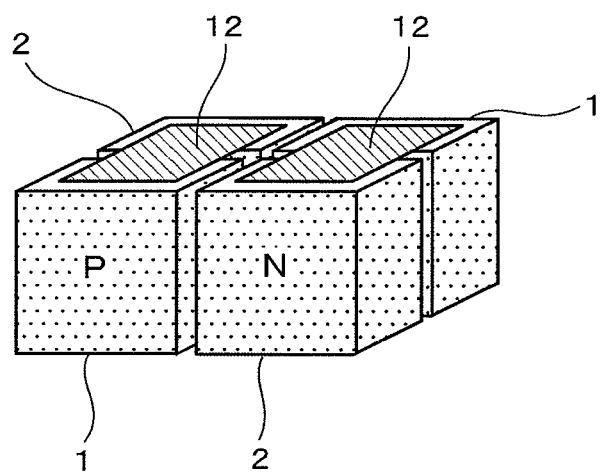
FIG. 7 is a diagram illustrating the respective thermoelectric elements connected in series through electrodes in a step for manufacturing a thermoelectric conversion module according to the example of the present invention.
Figure 8:
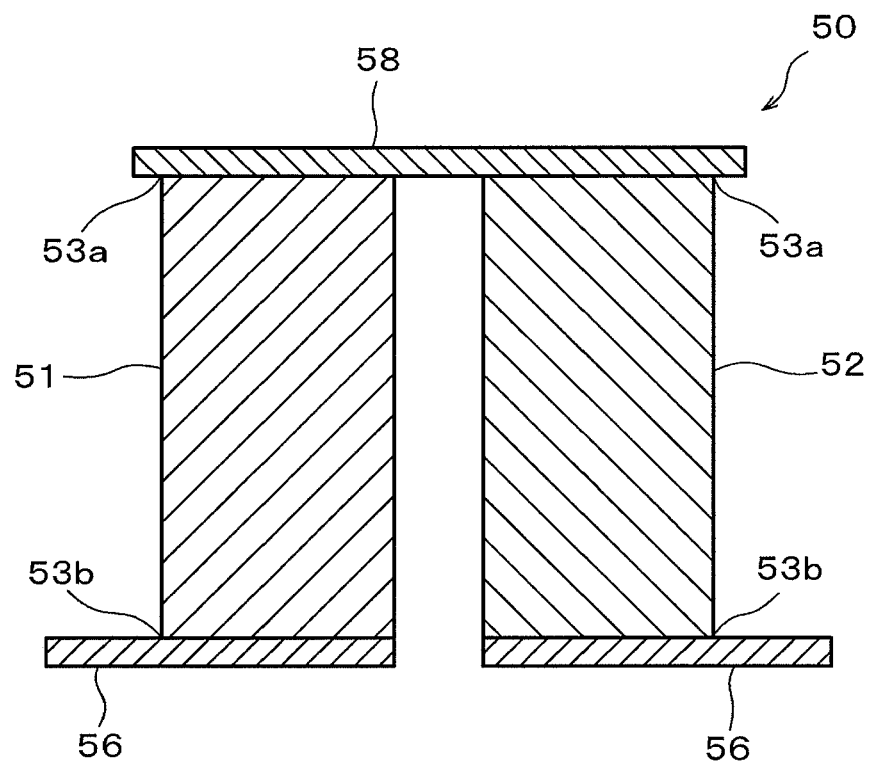
FIG. 8 is a diagram illustrating a conventional thermoelectric conversion module.
Figure 9A:
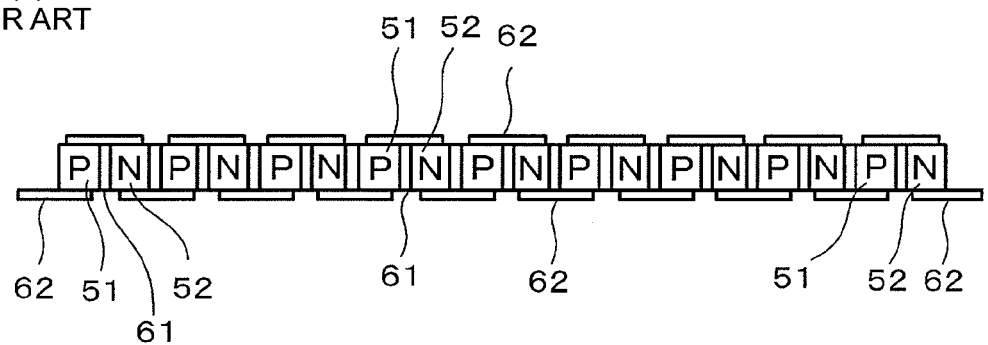
Figure 9B:
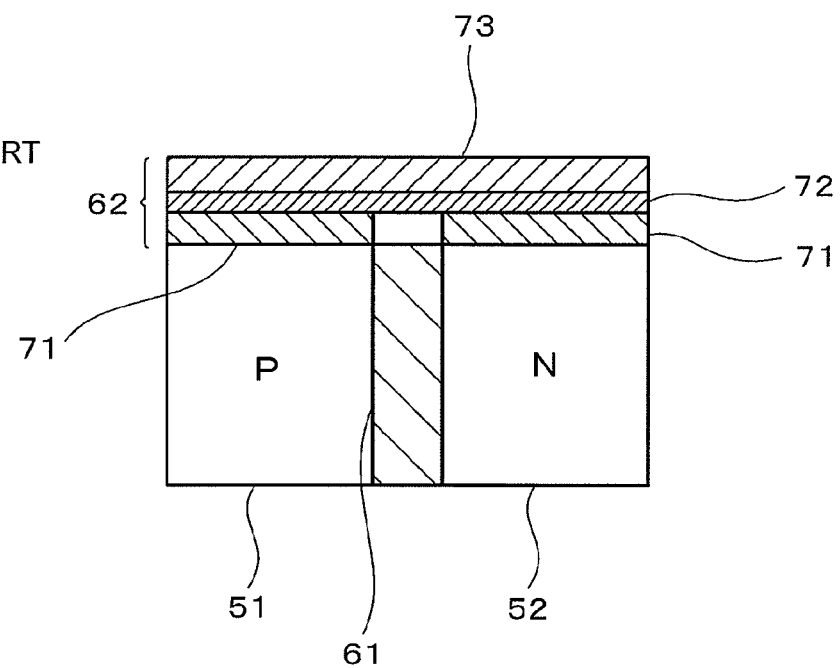

Then, the block of the thermoelectric elements (the P-type thermoelectric conversion materials 1 and the N-type thermoelectric conversion materials 2) joined in the way described above was introduced into a tunnel furnace set to 900° C., in which the first and second glass based materials were melted in the atmosphere to join (couple) the thermoelectric elements with the ceramic spherical particles and glass based materials interposed therebetween, as shown in FIG. 6.

Then, the surfaces of the block of the respective thermoelectric elements joined, which are to serve as conductive surfaces, that is, the top surface and bottom surface thereof were subjected to polishing.

Then, the elements were subjected to electrolytic Ni plating. It is to be noted that since the sides of the elements were covered with the glass for acting as resist, a Ni plating film was to be formed only on the top and bottom surfaces of the respective thermoelectric elements. Then, a Cu paste was applied by screen printing to the top and bottom surfaces of the respective thermoelectric elements with the Ni plating film formed thereon, in such a way that the thermoelectric elements (the P-type thermoelectric conversion materials 1 and the N-type thermoelectric conversion materials 2) were connected in series, copper plates were placed thereon, and baking was then carried out at 860° C. in nitrogen to manufacture a thermoelectric module as shown in FIG. 1 with the P-type thermoelectric conversion material 1 and the N-type thermoelectric conversion material 2 connected in series by the electrode 12 (the copper plate, see FIG. 2) (however, the electrode for connecting the P-type thermoelectric conversion material 1 and N-type thermoelectric conversion material 2 to each other is not illustrated in FIG. 1).

The sample (thermoelectric conversion module) manufactured in the way as described above was observed visually for the joining between the thermoelectric element and the glass based material to find the joining favorable.

In addition, the thermoelectric elements joined to each other with the glass based materials and ceramic spherical particles interposed therebetween were observed visually to find that the thermoelectric elements were rigidly joined to each other without peeling, breaking, or cracking found.

In addition, it has been confirmed that the resistance between the thermoelectric elements is so high from $10^4$ to $10^7 \Omega$ that the insulating property between the thermoelectric elements is kept high in the thermoelectric conversion module according to the example described above.

Furthermore, in the thermoelectric conversion module according to the example described above, it has been confirmed that the use of the ceramic spherical particles with a 3CV value of 20% or less indicating a variation in particle diameter results in the parallel joint surfaces of the thermoelectric elements, and thus allows the thermoelectric elements to be arranged in an aligned manner, thereby making it possible to ensure an increased occupancy of the thermoelectric elements.

It is to be noted that while the case of using the spherical zirconium oxide beads as the insulating material particles has been described by way of example in the example described above, the type of the insulating material particles is not particularly limited in the present invention, it is possible to use insulating material particles composed of various ceramic materials such as alumina and titania, and it is also possible in some cases to use insulating material particles composed of resin materials.

In addition, while the insulating glass was used as the adhesive materials in the example described above, it is also possible to use resin based materials instead of the insulating glass. Furthermore, since the adhesive materials are kept not in contact with each other, it is also possible in some cases to use, as the adhesive materials, materials other than insulating materials.

It is to be noted that the present invention is further not to be considered limited to the example described above in terms of other aspects, various applications and modifications can be made within the scope of the present invention, in terms of the compositions and raw materials of the P-type thermoelectric conversion material and the N-type thermoelectric conversion material, the specific structure of the thermoelectric conversion module, the specific conditions (for example, the size and the firing conditions, the number of thermoelectric conversion elements constituting the thermoelectric conversion module, etc.) at the time of manufacture, the types of the insulating material particles and adhesive materials, etc.

As described above, the present invention makes it possible to obtain a thermoelectric conversion module which has a structure of a P-type thermoelectric conversion material and an N-type thermoelectric conversion material joined with an insulating material interposed therebetween, which makes it possible to ensure that the joint surfaces of the P-type thermoelectric conversion material and the N-type thermoelectric conversion material are insulated from each other and has an increased occupancy of the thermoelectric conversion elements with high reliability.

Accordingly, the present invention can be applied widely in technical fields of thermoelectric conversion modules requiring an increased occupancy of thermoelectric conversion elements and high reliability.

The invention claimed is:

1. A thermoelectric conversion module comprising:
a P-type thermoelectric conversion material;
an N-type thermoelectric conversion material; and
insulating material particles joined to the P-type thermoelectric conversion material with a first adhesive material interposed therebetween and joined to the N-type thermoelectric conversion material with a second adhesive material interposed therebetween, wherein
the P-type thermoelectric conversion material and the N-type thermoelectric conversion material are electrically connected to each other in a region other than a region in which the P-type and N-type thermoelectric conversion materials are joined with the first adhesive material and the second adhesive material and the insulating material particles interposed therebetween, and
the insulating material particles have a diameter greater than the total thickness of the first and second adhesive materials to have the first material and the second adhesive material spaced from each other.

2. The thermoelectric conversion module according to claim 1, wherein the diameter of the insulating material particles have a 3 CV value of 20% or less.

3. The thermoelectric conversion module according to claim 2, wherein the insulating material particles are ceramic spherical particles, and wherein an average of the diameter of the insulating material particles is 0.05 to 0.6 mm.

4. The thermoelectric conversion module according to claim 1, wherein an average of the diameter of the insulating material particles is 0.05 to 0.6 mm.

5. The thermoelectric conversion module according to claim 1, wherein the insulating material particles are spherical zirconium oxide beads.

6. The thermoelectric conversion module according to claim 1, wherein the first and second adhesive materials are glass based materials.

7. The thermoelectric conversion module according to claim 1, wherein the first and second adhesive materials are not in contact with each other.

8. The thermoelectric conversion module according to claim 1, wherein the P-type thermoelectric conversion material and the N-type thermoelectric conversion material are electrically connected in series.

* * * * *